(12) United States Patent
Chen et al.

(10) Patent No.: US 9,154,886 B2
(45) Date of Patent: Oct. 6, 2015

(54) CAPACITIVE TRANSDUCER MANUFACTURING METHOD, AND MULTI-FUNCTION DEVICE

(75) Inventors: Jien-Ming Chen, Tainan (TW); Chin-Wen Huang, Hsinchu County (TW); Chin-Hung Wang, Hsinchu (TW); Hsin-Li Lee, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 471 days.

(21) Appl. No.: 13/456,206

(22) Filed: Apr. 25, 2012

(65) Prior Publication Data

US 2013/0160554 A1   Jun. 27, 2013

(30) Foreign Application Priority Data

Dec. 26, 2011  (TW) .............................. 100148641 A (51) Int. Cl.
| | |
|---|---|
| G01L 9/00 | (2006.01) |
| H04R 19/04 | (2006.01) |
| G01D 5/241 | (2006.01) |
| B81B 3/00 | (2006.01) |
| B06B 1/02 | (2006.01) |
| H04R 19/00 | (2006.01) |

(52) U.S. Cl.
CPC .............. *H04R 19/04* (2013.01); *B06B 1/0292* (2013.01); *B81B 3/0072* (2013.01); *G01D 5/2417* (2013.01); *H04R 19/00* (2013.01); *B81B 2201/0257* (2013.01); *H04R 2201/003* (2013.01); *Y10T 29/49117* (2015.01)

(58) Field of Classification Search
None
See application file for complete search history.

(56) References Cited

U.S. PATENT DOCUMENTS

| | | | |
|---|---|---|---|
| 5,573,679 A * | 11/1996 | Mitchell et al. ................... 216/2 |
| 6,732,588 B1 | 5/2004 | Mullenborn et al. | |
| 7,585,417 B2 | 9/2009 | Ho | |
| 7,781,249 B2 | 8/2010 | Laming et al. | |
| 7,839,052 B2 | 11/2010 | Wu et al. | |
| 7,856,804 B2 | 12/2010 | Laming et al. | |
| 7,936,497 B2 | 5/2011 | Chui et al. | |
| 2007/0058825 A1 | 3/2007 | Suzuki et al. | |
| 2007/0201710 A1 | 8/2007 | Suzuki et al. | |
| 2007/0286438 A1 | 12/2007 | Hirade et al. | |
| 2008/0019543 A1 | 1/2008 | Suzuki et al. | |
| 2008/0137884 A1 | 6/2008 | Kim et al. | |

(Continued)

FOREIGN PATENT DOCUMENTS

| | | |
|---|---|---|
| CN | 1387740 | 12/2002 |
| CN | 2927580 | 7/2007 |

(Continued)

OTHER PUBLICATIONS

"Office Action of Taiwan Counterpart Application", issued on May 2, 2014, p1-p5, in which the listed references were cited.

(Continued)

*Primary Examiner* — Lisa Caputo
*Assistant Examiner* — Brandi N Hopkins
(74) *Attorney, Agent, or Firm* — Jianq Chyun IP Office (57) ABSTRACT

A capacitive transducer and manufacturing method thereof is provided. A multifunction device including a plurality of the capacitive transducers is also provided, where the capacitive transducers are disposed on a substrate and include at least one microphone and at least one pressure sensor or ultrasonic device.

21 Claims, 10 Drawing Sheets

(56) References Cited

U.S. PATENT DOCUMENTS

| | | |
|---|---|---|
| 2009/0200620 A1 | 8/2009 | Omura et al. |
| 2010/0164025 A1 | 7/2010 | Yang |

FOREIGN PATENT DOCUMENTS

| | | |
|---|---|---|
| CN | 101406069 | 4/2009 |
| CN | 101572850 | 11/2009 |
| TW | 200612764 | 4/2006 |
| TW | 200740687 | 11/2007 |
| TW | 200926864 | 6/2009 |
| TW | 200945570 | 11/2009 |
| TW | 201127738 | 8/2011 |

OTHER PUBLICATIONS

Loeppert et al., "SiSonic—The First Commercialized MEMS Microphone," Solid-State Sensors, Actuators, and Microsystems Workshop, Jun. 4-8, 2006, pp. 27-30.

Huang et al, "Implementation of the CMOS MEMS Condenser Microphone with Corrugated Metal Diaphragm and Silicon Back-Plate," Sesnors 11, Jun. 10, 2011, pp. 6257-6269.

Weigold et al, "A MEMS Condenser Microphone for Consumer Applications," 2006 19th IEEE International Conference on Micro Electro Mechanical Systems, Jan. 22-26, 2006, pp. 86-89.

"Office Action of China Counterpart Application", issued on Nov. 24, 2014, p1-p11, in which the listed references were cited.

* cited by examiner

CAPACITIVE TRANSDUCER MANUFACTURING METHOD, AND MULTI-FUNCTION DEVICE

CROSS-REFERENCE TO RELATED APPLICATION

This application claims the priority benefit of Taiwan application no. 100148641, filed on Dec. 26, 2011. The entirety of the above-mentioned patent application is hereby incorporated by reference herein and made a part of this specification.

TECHNICAL FIELD

The disclosure relates to a capacitive transducer, a manufacturing method thereof, and a multi-function device having the same.

BACKGROUND

In order to effectively reduce product size, micro-electro-mechanical-systems (MEMS) have been developed with better integration and lower cost to meet the recent trend of developing multi-function miniature electronic products.

Capacitive transducers use membranes which sense vibrations generated by pressure variations in various types of MEMS devices, such as MEMS microphones and pressure sensors. Capacitive transducers convert the pressure variation signals to electrical signals, and sense various types of pressure ranges. The sensing mechanism depends on these membranes, and the sensitivity of the MEMS devices can be adversely impacted by their material and structure, which may be easily deformed by ambient temperature and process residual stress variations. When capacitive transducers encounter a large impacting force from a device drop, the sensing membrane can also be damaged, which affects the sensitivity of the MEMS device and the sensing quality.

SUMMARY

One of the present embodiments comprises a capacitive transducer. The capacitive transducer comprises a substrate having an opening, a second electrode having a center portion opposite the opening and an edge portion surrounding the center portion, where the center portion and the edge portion are discontinuous structures, and a first electrode is suspended between the opening of the substrate and the center portion of the second electrode, where the first electrode and the second electrode are separated by a spacing, and a supporting beam structure connects the structure and supports the center portion of the second electrode and the first electrode.

Another of the present embodiments comprises a multi-function device. The multi-function device comprises a plurality of capacitive transducers, where the capacitive transducers are disposed on a substrate and include at least one microphone and at least one pressure sensor or ultrasonic device.

Another embodiment introduces a manufacturing method of a capacitive transducer. The method comprises forming a first electrode on a substrate, exposing a portion of the substrate, forming a supporting beam structure on the substrate, which partially overlaps the first electrode, forming a dielectric layer on the substrate covering the supporting beam structure, forming a second electrode on the dielectric layer above the first electrode wherein a center portion and an edge portion surrounding the center portion of the second electrode are discontinuous structures and the dielectric layer is exposed by the second electrode, removing a portion of the substrate to form an opening corresponding to the location of the center portion of the second electrode, and exposing the first electrode, and removing the dielectric layer exposed by the second electrode corresponding to the center portion of the second electrode, to fabricate a suspended structure.

DESCRIPTION OF EMBODIMENTS

With reference to the drawings attached, the disclosure will be described by means of the embodiments below. Nevertheless, the disclosure may be embodied in many different forms and should not be construed as limited to the embodiments set forth herein. In the drawings, for the purpose of clarity and specificity, the sizes and the relative sizes of each layer and region may not be illustrated in accurate proportion.

Unless specified in the disclosure, one element or layer being "located on another element or layer" may represent the element or layer being directly located on another element or layer, or a middle element or layer may be disposed between the two elements. Moreover, directional terminology such as "above", "below", or other similar terms is used to describe the orientation of one element with respect to another (or a plurality of) elements in the Figure(s). Besides describing the spatial states shown in the Figures, this language used to depict the relative spatial relationships in the drawings may also describe the direction of the elements in use or in operation. For instance, when the elements in the drawings are turned upside down, the element depicted as being located or characterized "below" or "under" another element is then located or characterized as being "above" the other element.

Furthermore, although the description uses "first", "second", or like terms to characterize each element, region, or layer, this language is used to differentiate one element, region, or layer from another element, region, or layer. Therefore, without swaying from the spirit of the disclosure, the first element, region, or disclosure may also be viewed as the second element, region, or layer.

In some embodiments of the disclosure, a supporting beam structure is used to simultaneously suspend the first and second electrodes of the MEMS capacitive transducer, so the structures are suspended and separated from external elements, thereby releasing stresses through the deformations. Moreover, due to the easing of the impacting force in a device drop, the device reliability is enhanced. Several embodiments are described below to illustrate the apparatus and the manufacturing method thereof.

Figure 3A:
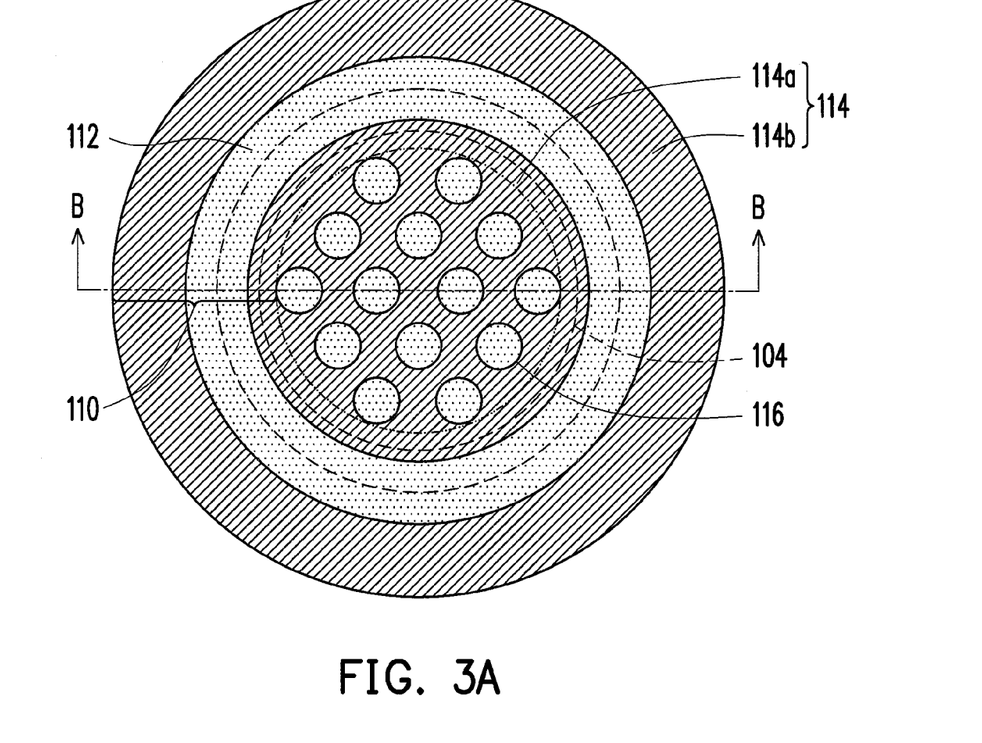
Figure 3B:
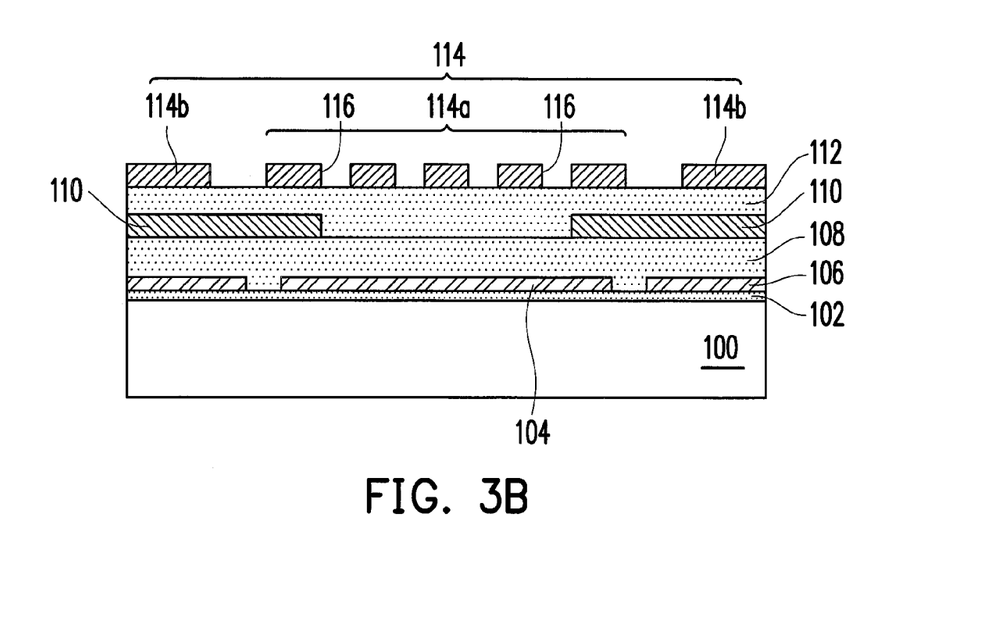
Figure 4A:
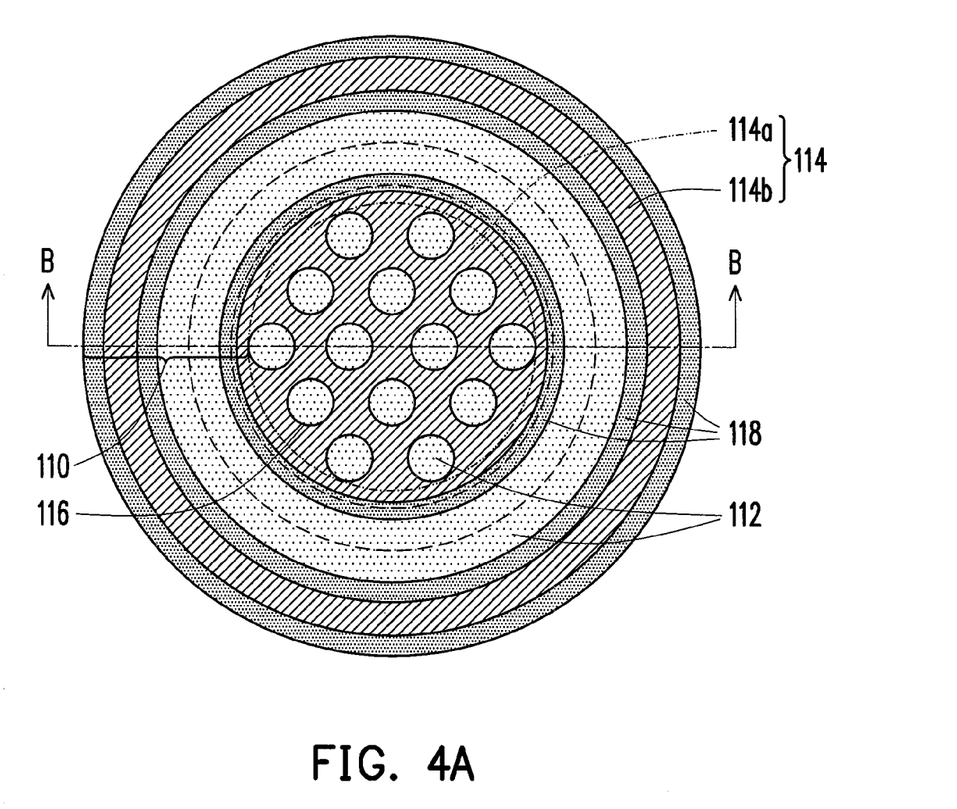
Figure 4B:
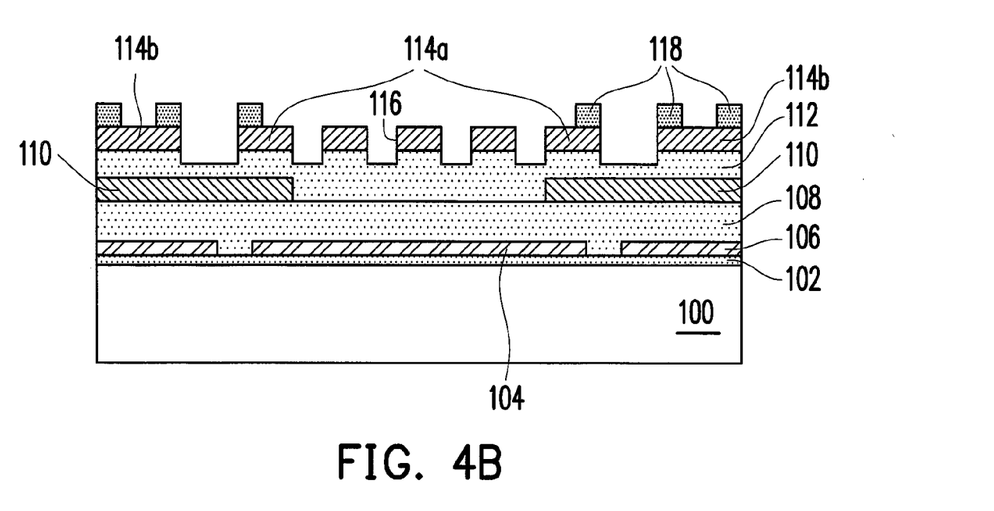
Figure 5:
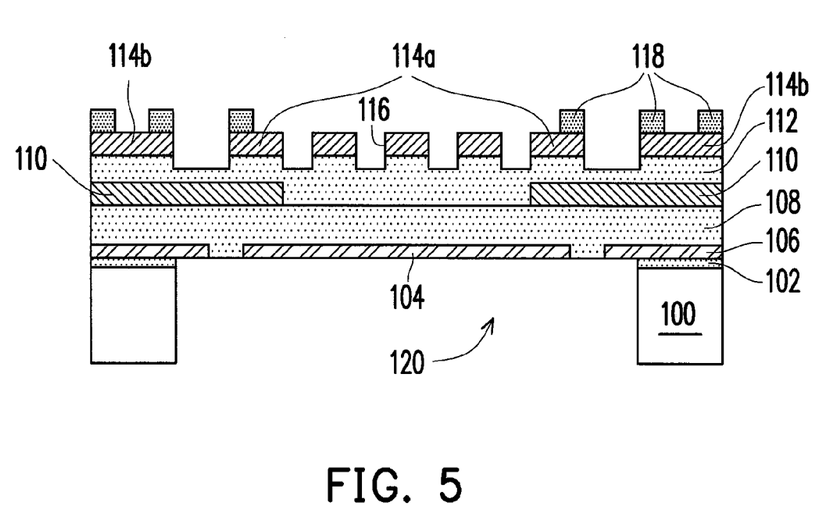
FIG. 5 is a cross-sectional view of the steps between FIG. 4A and FIG. 6A.

FIGS. 1A to 6B are schematic views showing the process of manufacturing a capacitive transducer according to an exemplary embodiment, in which FIGS. 1A, 2A, 3A, 4A, and 6A are top views, and FIGS. 1B, 2B, 3B, 4B, and 6B are cross-sectional views of the top views taken along a B-B line. FIG. 5 is a cross-sectional view of the steps between FIG. 4A and FIG. 6A.

Figure 1A:
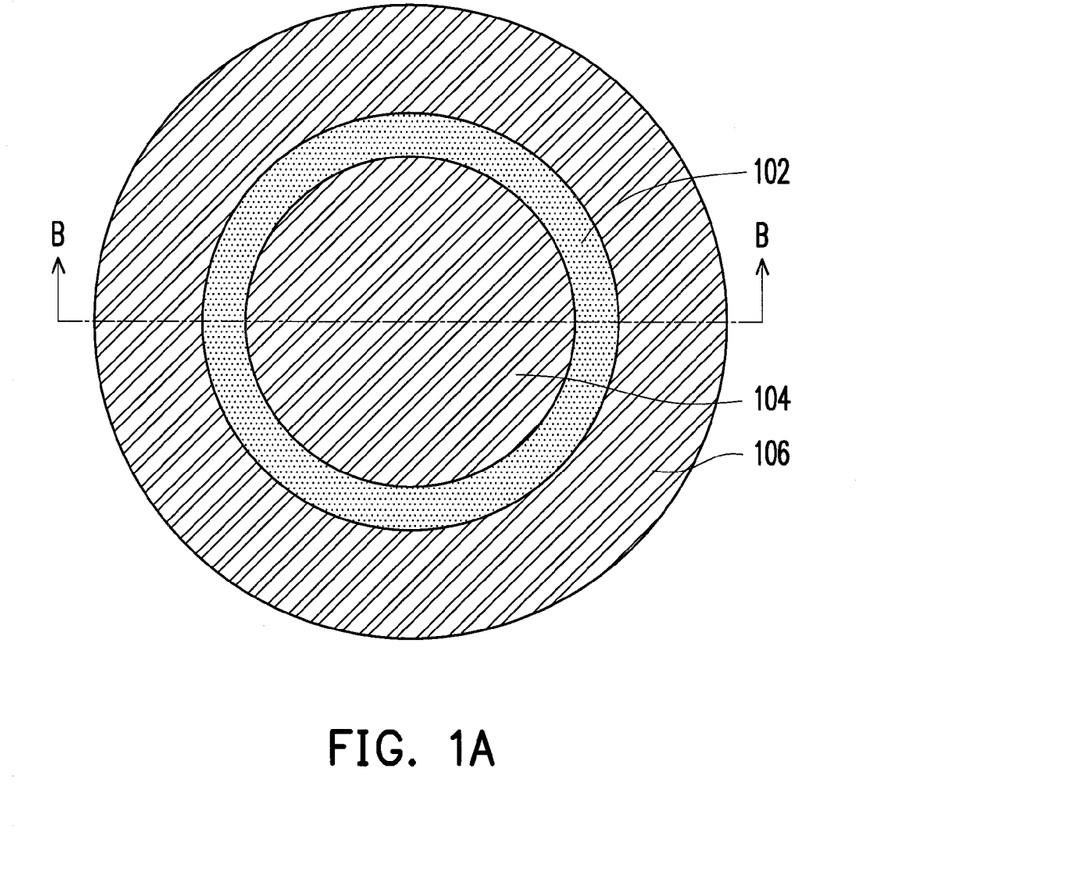
FIGS. 1A, 2A, 3A, 4A, and 6A are top views of a manufacturing method of a capacitive transducer according to a first embodiment of the disclosure.
Figure 1B:
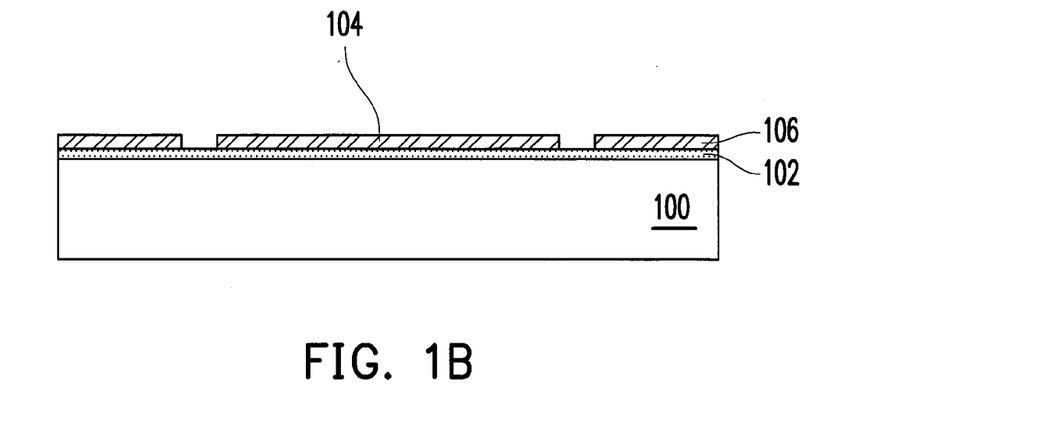
FIGS. 1B, 2B, 3B, 4B, and 6B are cross-sectional views taken along a sectional line B-B' of the top views.

Referring to FIGS. 1A and 1B, an oxide layer 102 is selectively formed on a substrate 100, in which a material of the substrate 100 may be silicon or other suitable materials, and the oxide layer 102 may be a thermal oxide layer or a chemical vapor deposition (CVD) oxide layer. The first electrodes 104 and 106 are formed on the oxide layer 102. The first electrode 104 is not connected to the first electrode 106 around the first electrode 104. Moreover, a material of the first electrode 104 may be polysilicon or other suitable material.

Figure 1C:
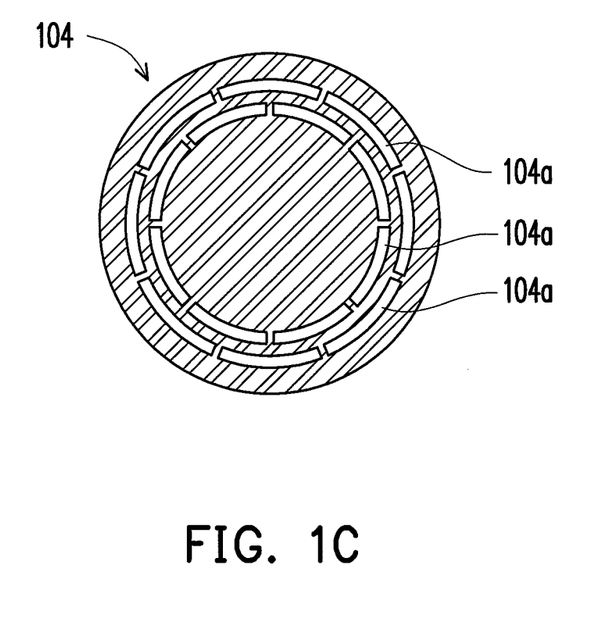
FIG. 1C is a top view of a first electrode having slots according to the first embodiment of the disclosure.

The manufacturing process of the first electrodes 104 and 106 typically involves first depositing an entire layer, then using a photolithography process or a similar process to pattern the deposited layer into two disconnected structures, leaving only a portion including the first electrode 104. The portion including the first electrode 104 may be as depicted in FIG. 1C. The first electrode 104 has a plurality of slots 104a used to release the residual stress on the first electrode 104. The portion including the slots 104a may be formed at the same time as the patterning process described above. The shape of the slots 104a is not limited to the shape illustrated in FIG. 1C. Another possible reference for the shape is the sensing membrane in Taiwan patent publication No. 200926864, the disclosure of which is incorporated herein by reference.

Figure 2A:
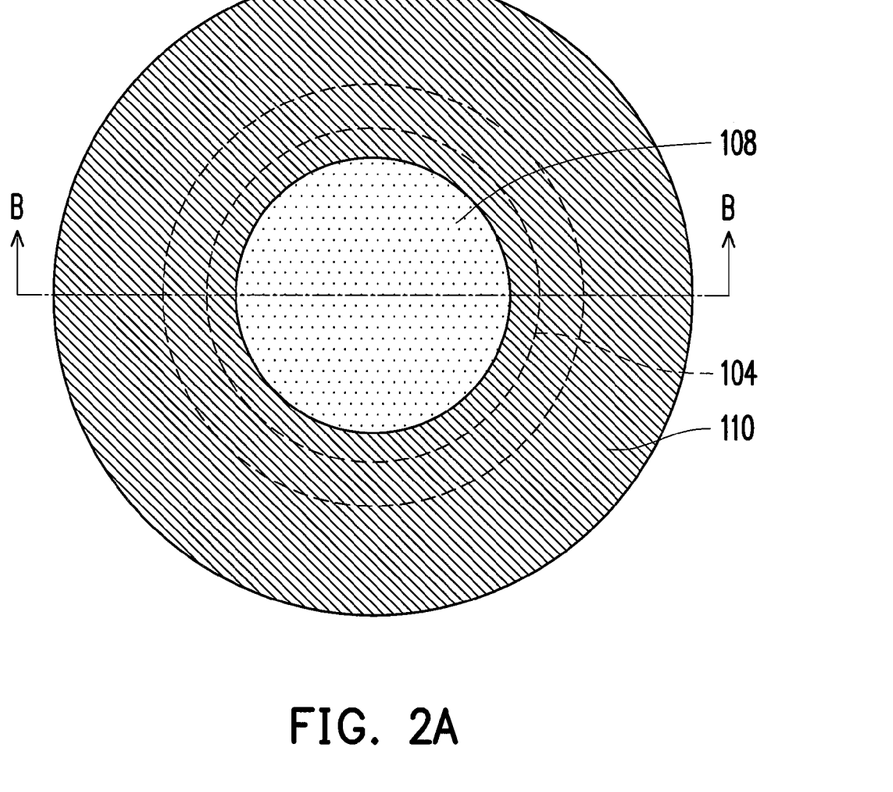
Figure 2B:
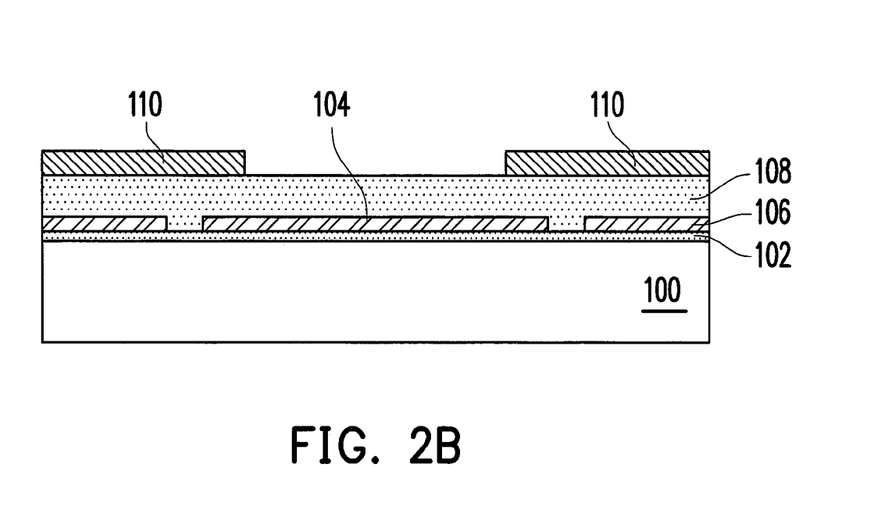
Figure 2C:
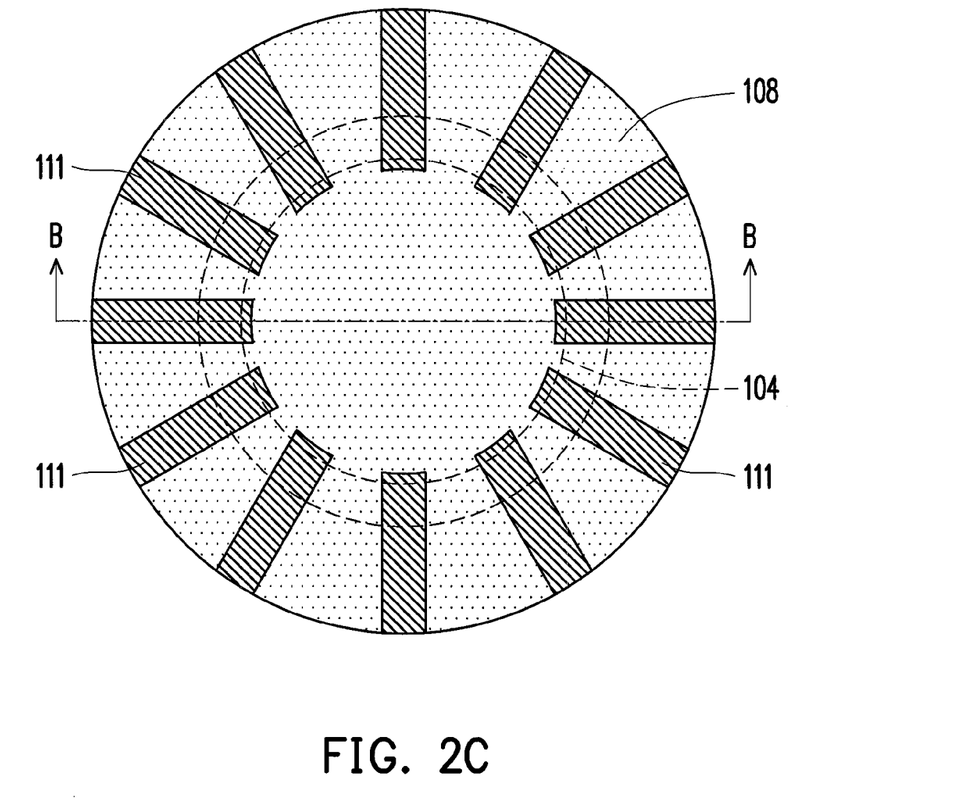
FIG. 2C is a top view of a plurality of supporting beam structures according to the first embodiment of the disclosure.

Referring to FIGS. 2A and 2B, a first dielectric layer 108 is selectively formed on the substrate 100 covering the first electrodes 104 and 106 and the oxide layer 102, in which a material of the first dielectric layer 108 includes BPSG, $SiO_2$, PSG, SAUSG, and SOG, for example. A supporting beam structure 110 is formed on the first dielectric layer 108 above the substrate 100, in which a material of the supporting beam structure 110 includes metal or silicon nitride, but the disclosure is not limited thereto. The supporting beam structure 110 is located above and slightly covers the edges of the first electrode 104. Additionally, the supporting beam structure 110 depicted in FIG. 2A is a single ring shaped structure, although the disclosure is not limited thereto. The top view in FIG. 2C constitutes a plurality of supporting beam structures 111.

Referring to FIGS. 3A and 3B, a second dielectric layer 112 is selectively formed on the substrate 100 covering the first dielectric layer 108 and the supporting beam structure 110, in which a material of the second dielectric layer 112 includes BPSG, $SiO_2$, PSG, SAUSG, and SOG, for example. A second electrode 114 is formed on the second dielectric layer 112. The second electrode 114 has a center portion 114a and an edge portion 114b surrounding the center portion, and the center portion 114a and the edge portion 114b are discontinuous structures. The second electrode 114 is a conductive layer made of metal or polysilicon, for example. Furthermore, in order to coordinate with subsequent fabrication processes and applications, the center portion 114a of the second electrode may have a plurality of holes 116.

Referring to FIGS. 4A and 4B, an insulating layer 118 exposing the second dielectric layer 112 is formed on the second electrode 114, and an etching step defining the insulating layer 118 can be used to continue etching a portion of the second dielectric layer 112. Referring to FIG. 5, the holes 120 (i.e. the back chambers) are defined on the substrate 100 and the oxide layer 102 is etched, by using inductive coupling plasma (ICP) etching and vapor-HF dry etching, for example. After etching, the entire first electrode 104 and a portion of the first electrode 106 are exposed, and the locations of the holes 120 and the center portion 114a of the second electrode 114 correspond to each other.

Figure 6A:
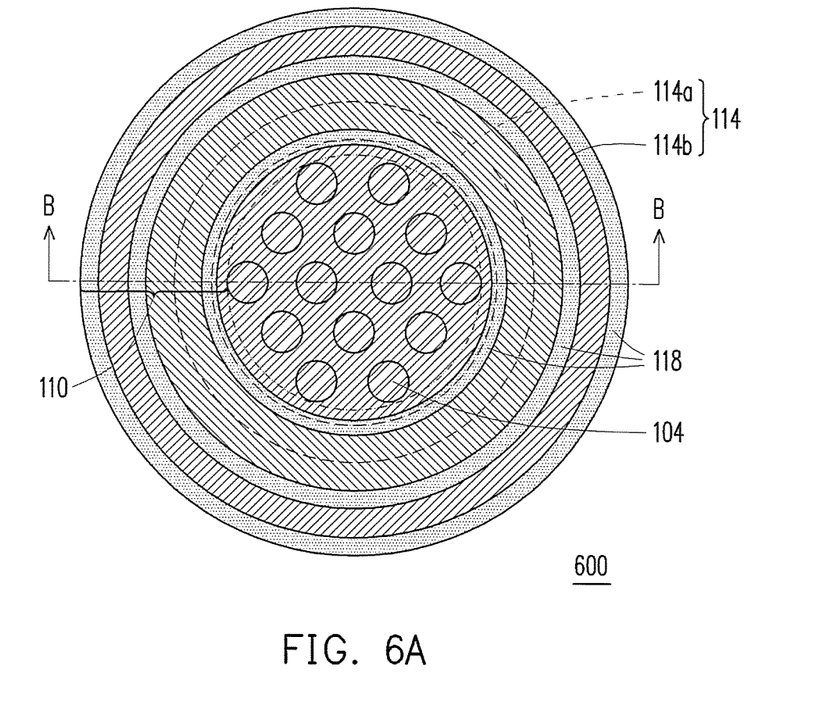
Figure 6B:
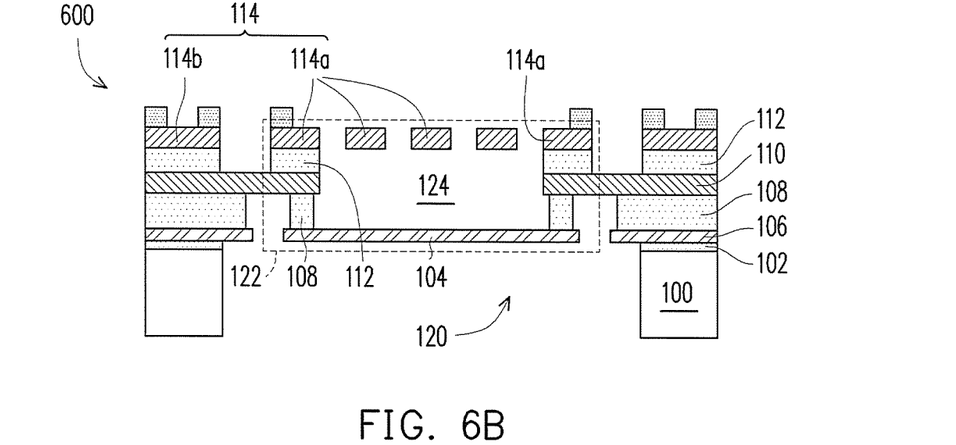

Referring to FIGS. 6A and 6B, by using a wet etch process, the second dielectric layer 112 exposed by the second electrode 114 and corresponding to the center portion 114a, and the first dielectric layer 108 exposed between the first electrodes 104 and 106, are removed, so as to fabricate a suspended structure 122 forming a capacitive transducer 600. In the capacitive transducer 600, the first electrode 104 and the center portion 114a of the second electrode 114 are separated by a spacing 124. Interconnecting lines (not drawn) such as vias may be used for electrical connections, with the outer conductive lines of the first electrode 104 and the center portion 114a of the second electrode 114 serving as the upper and lower electrodes. The capacitive transducer 600 of the present embodiment may be used in microphones.

The first electrode 104 and the center portion 114a of the second electrode 114 are connected by only a supporting beam structure 110, and the first electrode 104 and the center portion 114a of the second electrode 114 are separated from the other sections. Accordingly, stresses can be released by deformations when the ambient temperature varies, and the impacting force in a device drop can be decreased, thereby enhancing the device reliability.

Figure 7:
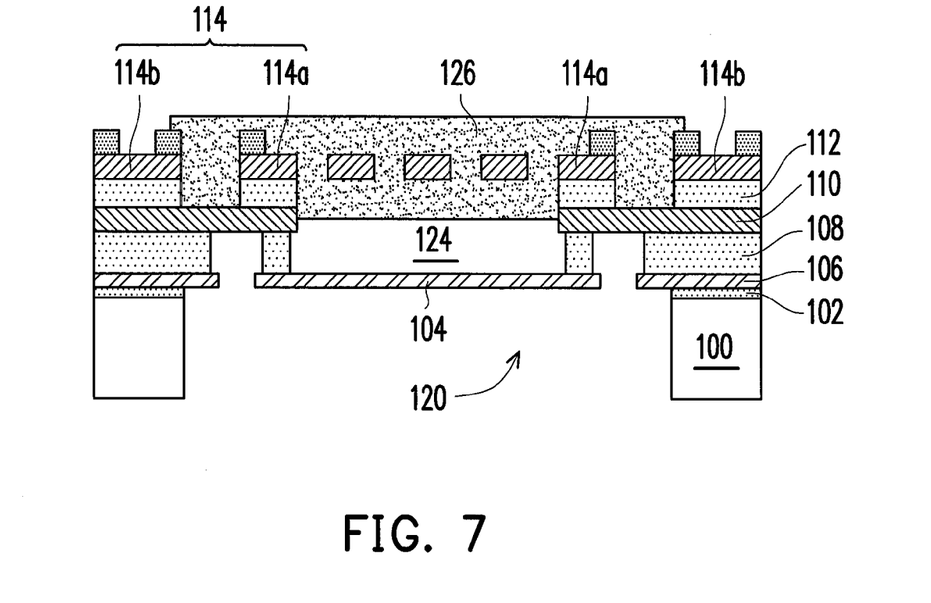
FIG. 7 is a cross-sectional view of another application of the capacitive transducer according to the first embodiment of the disclosure.

FIG. 7 is a schematic cross-sectional view of another application for the capacitive transducer according to the first embodiment. The same reference numerals are used in FIG. 7 as those in FIG. 6B to represent the same or similar elements. In FIG. 7, an organic/inorganic material 126 may cover the second electrode 114, such as SiN, SiO2, or parylene, for example, so as to seal the second electrode 114 and make the capacitive transducer applicable for use as a pressure sensor or ultrasonic device such as an ultrasonic transducer. However, the spacing 124 should be maintained between the first electrode 104 and the center portion 114a of the second electrode 114. In applications for use as a pressure sensor or ultrasonic device, the slot pattern of the membrane illustrated in FIG. 1C is not needed to fabricate the first electrode 104.

Figure 8:
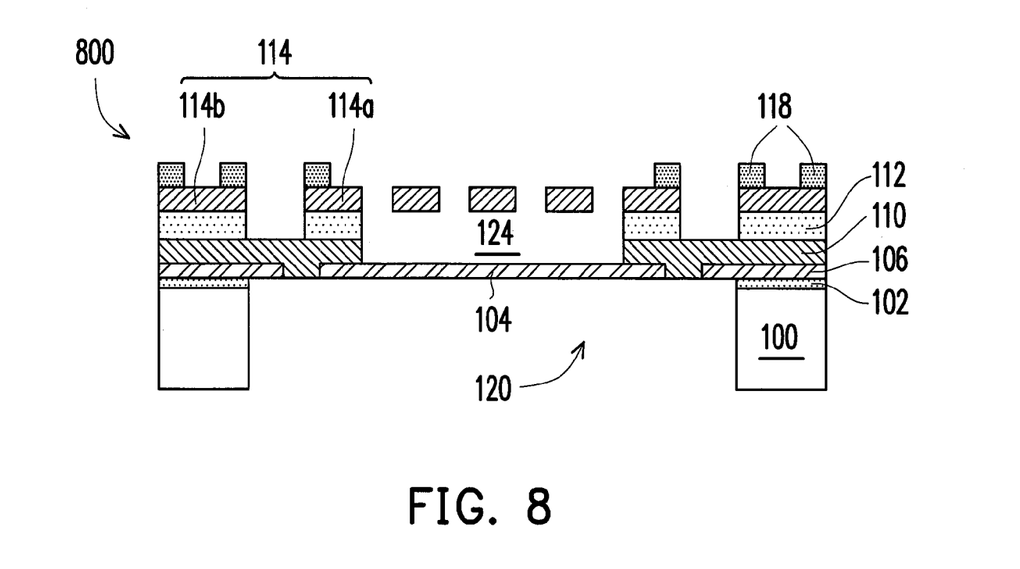
FIG. 8 is a cross-sectional view of a capacitive transducer according to a second embodiment of the disclosure.

FIG. 8 is a schematic cross-sectional view of a capacitive transducer according to a second embodiment of the disclosure, in which elements identical or similar to those in the first embodiment are represented with the same reference numerals. A difference between a capacitive transducer 800 depicted in FIG. 8 and the first embodiment is that, the supporting beam structure 110 directly contacts the first electrode 104 without a dielectric layer therebetween.

Figure 9:
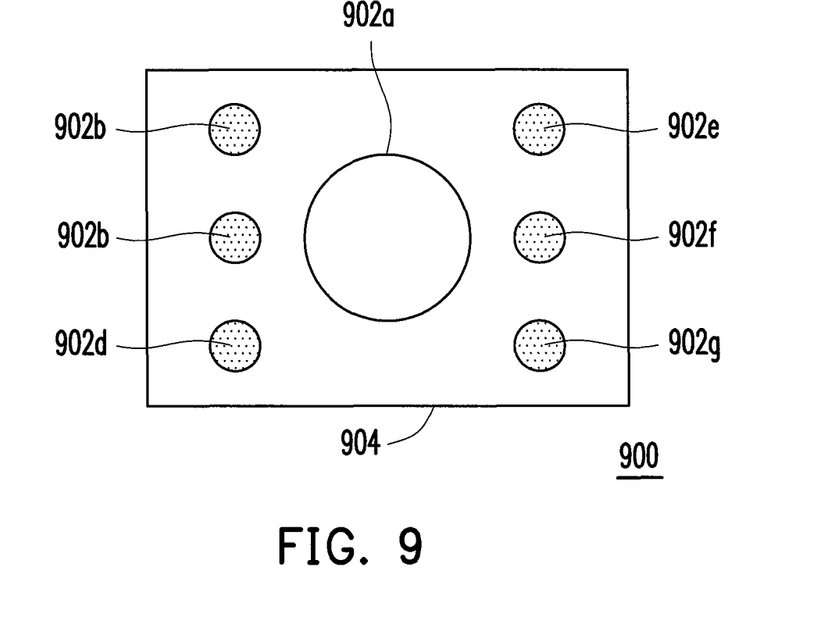
FIG. 9 is a schematic view of a multi-function device according to a third embodiment of the disclosure.

FIG. 9 is a schematic view of a multi-function device according to a third embodiment of the disclosure. In FIG. 9, a multi-function device 900 has a plurality of capacitive transducers 902a-902g disposed on a same substrate 904, including a microphone 902a and a plurality of pressure sensors or ultrasonic devices 902b-902g such as ultrasonic transducers. The capacitive transducers 902a-902g of the present embodiment may be the capacitive transducers described in the embodiments illustrated above. The manufacturing process of the capacitive transducers 902a-902g is the same, with the difference being only in the device size and an extra sealing step for the second electrode in the pressure sensor and the ultrasonic device 902b-902g. Therefore, devices having different functions can be integrated on a same substrate 904.

Figure 10:
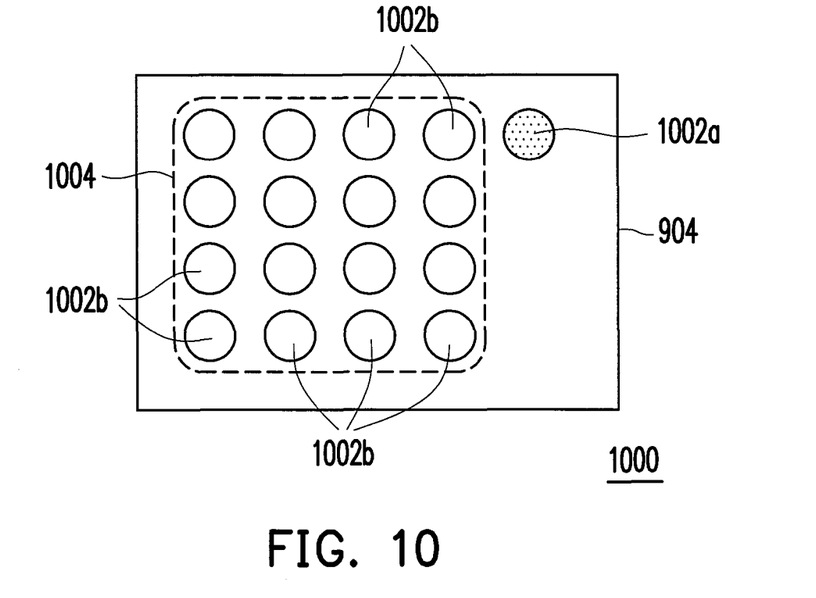
FIG. 10 is a schematic view of another multi-function device according to a fourth embodiment of the disclosure.

FIG. 10 is a schematic view of another multi-function device according to a fourth embodiment of the disclosure. In FIG. 10, a multi-function device 1000 includes a pressure sensor or an ultrasonic device 1002a, and a microphone 1004 formed by a plurality of capacitive transducers 1002b arranged in an array. Since the device size of the capacitive transducers 1002a-1002b disposed on the same substrate 904 may be the same or similar, the capacitive transducers described in the first and second embodiments may be employed.

In view of the foregoing, the capacitive transducer according to the disclosure employs a supporting beam structure to suspend and separate the first electrode and the second electrode from the external elements. Therefore, the stresses can be released through deformations when the first and/or the second electrodes are affected by ambient temperature variations. The supporting beam structure can decrease the impacting force endured during a device drop. Multi-functionality can be achieved by fabricating capacitive transducers with different functions on a same substrate.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A capacitive transducer, comprising:
a substrate having an opening;
a first electrode disposed on a surface of the substrate;
at least one supporting beam structure disposed on the first electrode, wherein the supporting beam structure connects the substrate and supports the first electrode;
a second electrode disposed on the supporting beam structure and opposite the surface of the substrate, wherein the second electrode and the first electrode are separated by a spacing, the second electrode has a center portion opposite the opening and an edge portion surrounding the center portion, the center portion of the second electrode is supported by the supporting beam structure, and the center portion and the edge portion are discontinuous structures,
the first electrode suspends between the opening of the substrate and the second electrode through the supporting beam structure; and
a first dielectric layer disposed between the supporting beam structure and the first electrode, wherein a bottom of the first electrode is entirely exposed toward the opening without the first dielectric layer.

2. The capacitive transducer as claimed in claim 1, further comprising a second dielectric layer disposed between the supporting beam structure and the second electrode.

3. The capacitive transducer as claimed in claim 1, wherein the supporting beam structure directly contacts the first electrode.

4. The capacitive transducer as claimed in claim 1, wherein the first electrode has a plurality of slots to release residual stress on the first electrode.

5. The capacitive transducer as claimed in claim 1, wherein a material of the at least one supporting beam structure comprises at least metal or silicon nitride.

6. The capacitive transducer as claimed in claim 1, wherein a material of the first electrode comprises at least polysilicon.

7. The capacitive transducer as claimed in claim 1, wherein the capacitive transducer is applied in a microphone.

8. The capacitive transducer as claimed in claim 1, wherein the center portion of the second electrode comprises a plurality of holes.

9. The capacitive transducer as claimed in claim 1, further comprising an organic material disposed on the second electrode to seal the second electrode.

10. The capacitive transducer as claimed in claim 1, further comprising an inorganic material disposed on the second electrode to seal the second electrode.

11. The capacitive transducer as claimed in claim 9, wherein the capacitive transducer is applied in a pressure sensor or an ultrasonic device.

12. The capacitive transducer as claimed in claim 10, wherein the capacitive transducer is applied in a pressure sensor or an ultrasonic device.

13. A multi-function device, comprising a plurality of the capacitive transducers as claimed in claim 1, wherein the capacitive transducers are disposed on a same substrate and comprise at least one microphone and at least one pressure sensor.

14. The multi-function device as claimed in claim 13, wherein the microphone is formed by the capacitive transducers arranged in all array.

15. A method of manufacturing a capacitive transducer, comprising:
forming a oxide layer on a substrate;
forming a first electrode on the oxide layer, the first electrode exposing a portion of the oxide layer;
forming a supporting beam structure on the substrate, the supporting beam structure partially overlapping the first electrode;
forming a dielectric layer on the substrate covering the supporting beam structure;
forming a second electrode on the dielectric layer above the first electrode, wherein a center portion and an edge portion surrounding the center portion of the second electrode are discontinuous structures, and the dielectric layer is exposed by the second electrode;
removing a portion of the substrate to form an opening corresponding to the location of the center portion of the second electrode, and to expose the oxide layer from the opening;
removing the oxide layer exposed by the opening to entirely expose a bottom of the first electrode toward the opening; and removing the dielectric layer exposed by the second electrode and corresponding to the center portion of the second electrode, so as to fabricate a suspended structure.

16. The method of manufacturing the capacitive transducer as claimed in claim 15, wherein before forming the supporting beam structure on the substrate, further comprising forming another dielectric layer fully covering the first electrode.

17. The method of manufacturing the capacitive transducer as claimed in claim 16, wherein the step of fabricating the suspended structure comprises removing the other dielectric layer exposed by the second electrode.

18. The method of manufacturing the capacitive transducer as claimed in claim 15, wherein the step of the forming the first electrode on the substrate further comprises forming a plurality of slots in the first electrode to release residual stress on the first electrode.

19. The method of manufacturing the capacitive transducer as claimed in claim 15, wherein the step of the forming the second electrode on the dielectric layer comprises forming a plurality of holes in the center portion of the second electrode.

20. The method of manufacturing the capacitive transducer as claimed in claim 15, wherein the step of the forming the second electrode on the dielectric layer comprises forming a conductive layer on the dielectric layer.

21. The method of manufacturing the capacitive transducer as claimed in claim 15, wherein after fabricating the suspended structure, an organic/inorganic material is used to seal the second electrode.

\* \* \* \* \*